United States Patent
Lin et al.

(10) Patent No.: US 6,228,420 B1
(45) Date of Patent: May 8, 2001

(54) METHOD TO MAINTAIN CONSISTENT THICKNESS OF THIN FILM DEPOSITED BY CHEMICAL VAPOR DEPOSITION

(75) Inventors: Juen-Kuen Lin, Kaohsiung; Chien-Hsin Lai, Kaohsiung Hsien; Hao-Kuang Chiu; Fu-Yang Yu, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/420,961

(22) Filed: Oct. 20, 1999

(51) Int. Cl.[7] ................................................ C23C 16/00
(52) U.S. Cl. .................... 427/9; 427/248.1; 427/255.28; 427/255.36
(58) Field of Search ....................... 427/9, 248.1, 255.28, 427/255.36; 369/275.1, 276, 280

(56) References Cited

U.S. PATENT DOCUMENTS 4,388,342 * 6/1983 Suzuki et al. ............................ 427/8
5,741,547 * 4/1998 Akram et al. ..................... 427/255.2

* cited by examiner

Primary Examiner—Shrive Beck
Assistant Examiner—Michael Barr
(74) Attorney, Agent, or Firm—Thomas, Kayden, Horstemeyer & Risley

(57) ABSTRACT

A method to maintain a consistent thin film thickness deposited by chemical vapor deposition is described in which method a compensative coefficient K is provided. The initial preset deposition time $T_0$ is multiplied by the compensative coefficient K to obtain an actual deposition time T, where $T = K \times T_0$. Using the actual deposition time T to conduct the deposition, the expected thickness of the thin film is obtained.

5 Claims, 4 Drawing Sheets

METHOD TO MAINTAIN CONSISTENT THICKNESS OF THIN FILM DEPOSITED BY CHEMICAL VAPOR DEPOSITION

BACKGROUND OF THE INVENTION

1. Field of the Invention

The present invention relates to a chemical vapor deposition process. More particularly, the present invention relates to a method that improves the inconsistency of the wafer thin film thickness by chemical vapor deposition.

2. Description of the Related Art

Chemical vapor deposition is defined as the formation of a nonvolatile solid film on a substrate by the reaction of the vapor phase reactants that contain the desired components. If the reactant is a liquid at room temperature and atmospheric pressure, the reactant is vaporized before it is introduced into the reaction chamber.

There are two types of design for the reactant supply unit of a chemical vapor deposition system or reactor for the reactant, which is a liquid at room temperature. The first design heats the liquid reactant to increase the vapor pressure of the liquid reactant. The second design delivers a fixed amount of the carrier gas into the container of the liquid reactant. Using the carrier gas, the partial vapor pressure of the liquid reactant increases the flow rate of the liquid reactant is thus increased. The latter design has been more widely used because it is more convenient to control.

FIG. 1 is a schematic diagram showing parts of a chemical vapor deposition system using a carrier gas to deliver the reactant in a Very Large Scale Integrated circuit (VLSI) processing. As shown in FIG. 1, the liquid reactant, for example, tetrakisdimethyl-amidotitanium (TDMAT) is contained in an ampule 10 (or a bubbler chamber). The carrier gas, for example, helium (He), is delivered in a fixed flow rate into the ampule 10 by a mass flow controller 12 (MFC) to carry the TDMA vapor into a reaction chamber 14 for a chemical vapor deposition reaction after passing through the piping and combining with gases required for other processing conditions.

Using the mass flow controller 12 (MFC) to control the flow rate of the carrier gas delivered to the TDMAT, the flow rate of TDMAT is also controlled. By presetting the processing recipe of a particular process, the deposition system or reactor is automated to perform the chemical vapor deposition process.

After the reactor has been functioning for a certain time period, the thickness of the thin film deposited on the wafer, however, is different from the preset value without altering the pre-set condition. In other words, the flow rate of the carrier gas is supposed to remain unchanged. The extent of the difference between the preset value and the actual thickness of the deposited thin film increases as the number of times of the reactor is used increases.

These results indicate that the amount of the reactant being delivered into the reaction chamber 14 alters as the number of times and the duration of the operation accumulate. The resulting film thickness thus deviates from the preset value, which would lead to an inconsistent thin film thickness deposited on the different batches of the wafer. The quality of the product is therefore out of control.

Furthermore, there are at least two reaction chambers for each chemical vapor deposition system and each reaction chamber has its individual ampule 10. Since the number of operations accumulated for each reaction chamber is different, the extent of the deviation of the thickness of the deposited thin film from the preset value is different for each reaction chamber. In another words, the consumption rate of the reactant is different for different reaction chambers. The consumption rate of the reactant in each ampule, therefore, can not be exactly determined to provide a dependable schedule for replacing the ampule.

SUMMARY OF THE INVENTION

Based on the foregoing, the current invention provides a method to maintain a consistent thickness of the thin film deposited by chemical vapor deposition, in which a compensative coefficient K is provided and the actual deposition time T is determined by multiplying the compensative coefficient K by the preset deposition time $T_0$ for example, $T=K \times T_0$. The compensative coefficient K is determined from equation (1).

$$K = m_0/m(t) \qquad (1)$$

where $m_0$ and $m(t)$ are the initial mass flow rate of the reactant and the mass flow rate of the reactant after an accumulated time period t, respectively. The unit for K is weight per unit time, for example, kg/sec. $m(t)$ is determined from equation (2)

$$m(t) = m_0 \times (0.414 + 0.217 \times e^{(V_0/V(t))}) \qquad (2)$$

where $V_0$ is the volume occupied by the gas phase in the ampule, when the ampule is first filled the reactant. $V(t)$ is the volume occupied by the gas phase in the ampule after the reactant is delivered into the ampule for an accumulated time period t and $V_0 \leq V(t)$. Based on equation (2), $m(t)$ is affected by the volume occupied by gas in the ampule. After the chemical in the ampule is consumed, the volume occupied by the gas phase in the ampule increases and the concentration of the gas phase of the reactant thus becomes diluted.

The volume occupied by the gas phase $V(t)$ after an accumulated time period is determined by equation (3), where $$V(t) = V_0 + 4.57 \times 10^{-4} t \qquad (3).$$

When 90% of the reactant in the ampule is consumed, the ampule can be replaced. The time when the ampule should be replaced is determined by the following inequality equation (4).

$$W_0 - \int m(t) * t \leq (1-0.9) * W_0 \qquad (4)$$

where $W_0$ is the initial total weight of the reactant in the ampule.

According to the preferred embodiment of the present invention, a method to maintain a consistent thin film thickness deposited from chemical vapor deposition is provided. The method can be applied to a chemical vapor deposition system or reactor which includes at least a reaction chamber, an ampule, a mass flow controller and an information management device. The method further includes setting the values for $m_0$, $V_0$ and $W_0$ in the data management device, followed by obtaining the accumulated time period t from the mass flow controller. After this, the following calculations are conducted by the data management device:

(a) the value of t is substituted into equation (3) to determine the volume occupied by the gas phase in the ampule $V(t)$;

(b) the value of V(t) is substituted into equation (2) to obtain the mass flow rate of the reactant m(t);

(c) the value of m(t) is substituted into equation (1) to obtain the value of the compensative coefficient K.

The actual deposition time is determined by multiplying the value of K by the initial preset deposition time $T_0$. The actual deposition time T is then used to control the mass flow controller.

According to the preferred embodiment of the present invention, a method to maintain a consistent thickness of the thin film deposited by chemical vapor deposition is provided. The method includes a determining step to determine whether the ampule is to be replaced based on the equation (4). When 90% of the chemical solution is consumed, and only 10% remains, the ampule is replaced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1:
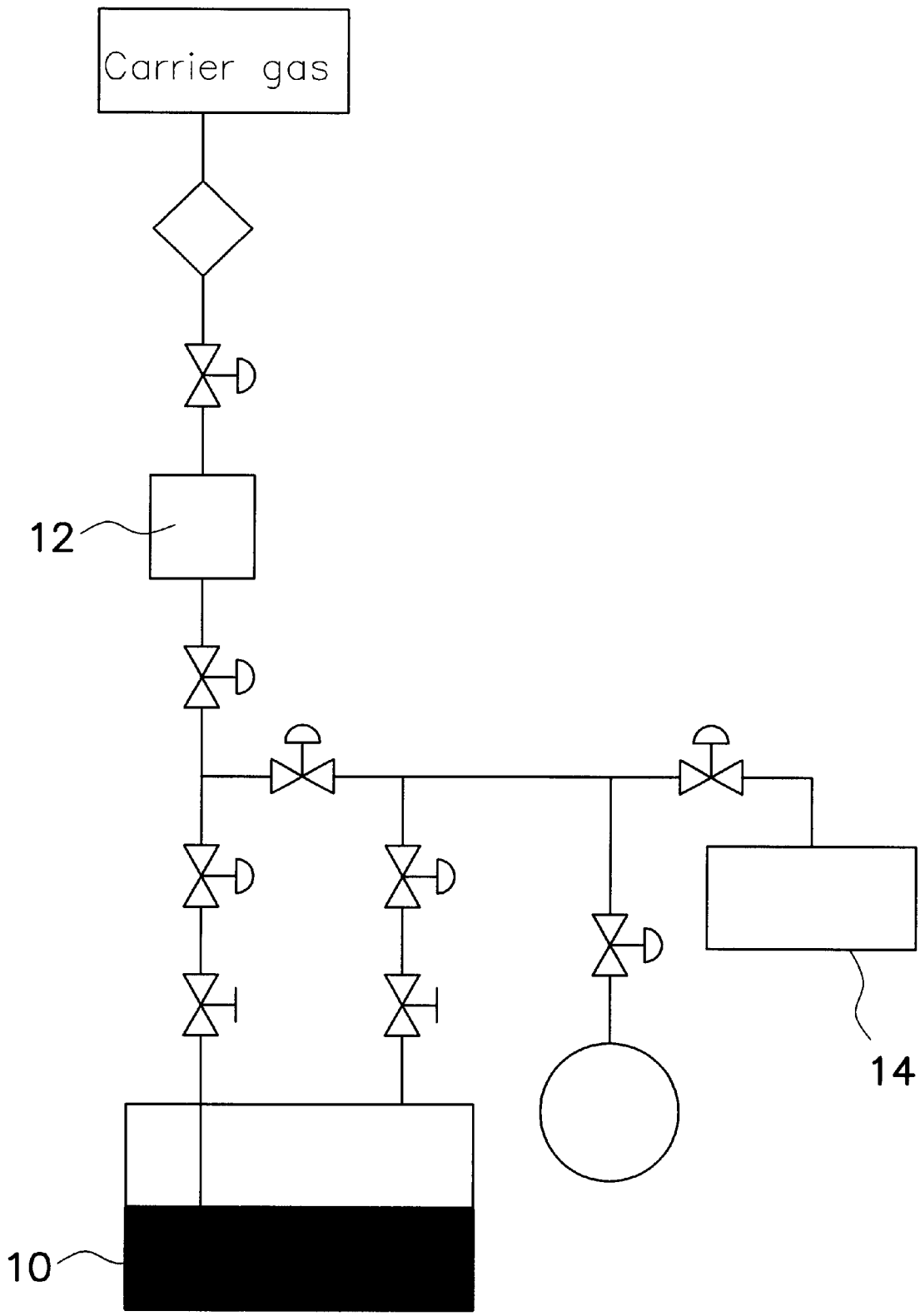
FIG. 1 is a schematic diagram showing some parts of the chemical vapor deposition system according to the prior art.
Figure 2:
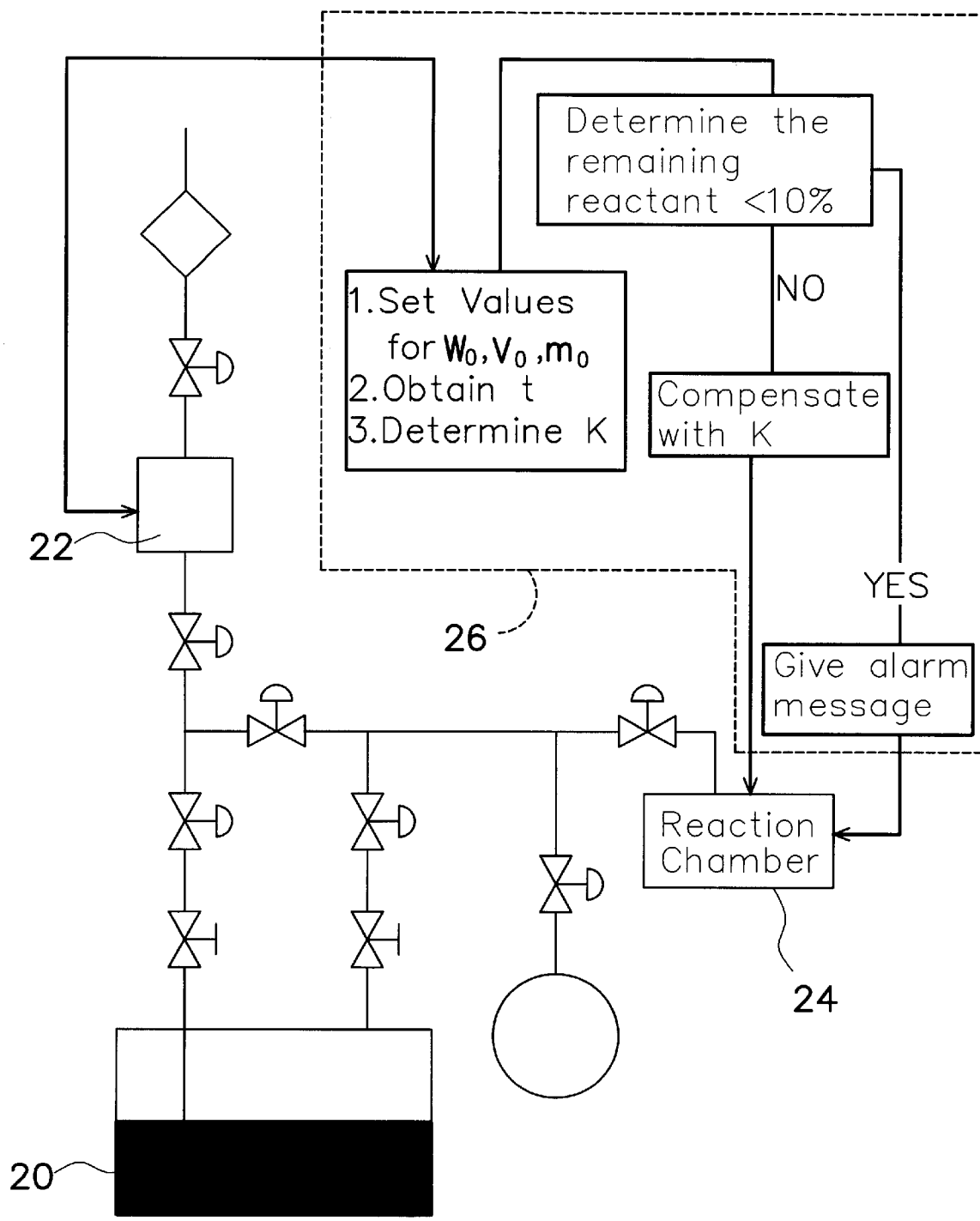
FIG. 2 is a schematic diagram showing some parts of the chemical vapor deposition system according to the preferred embodiment of the present invention.
Figure 3A:
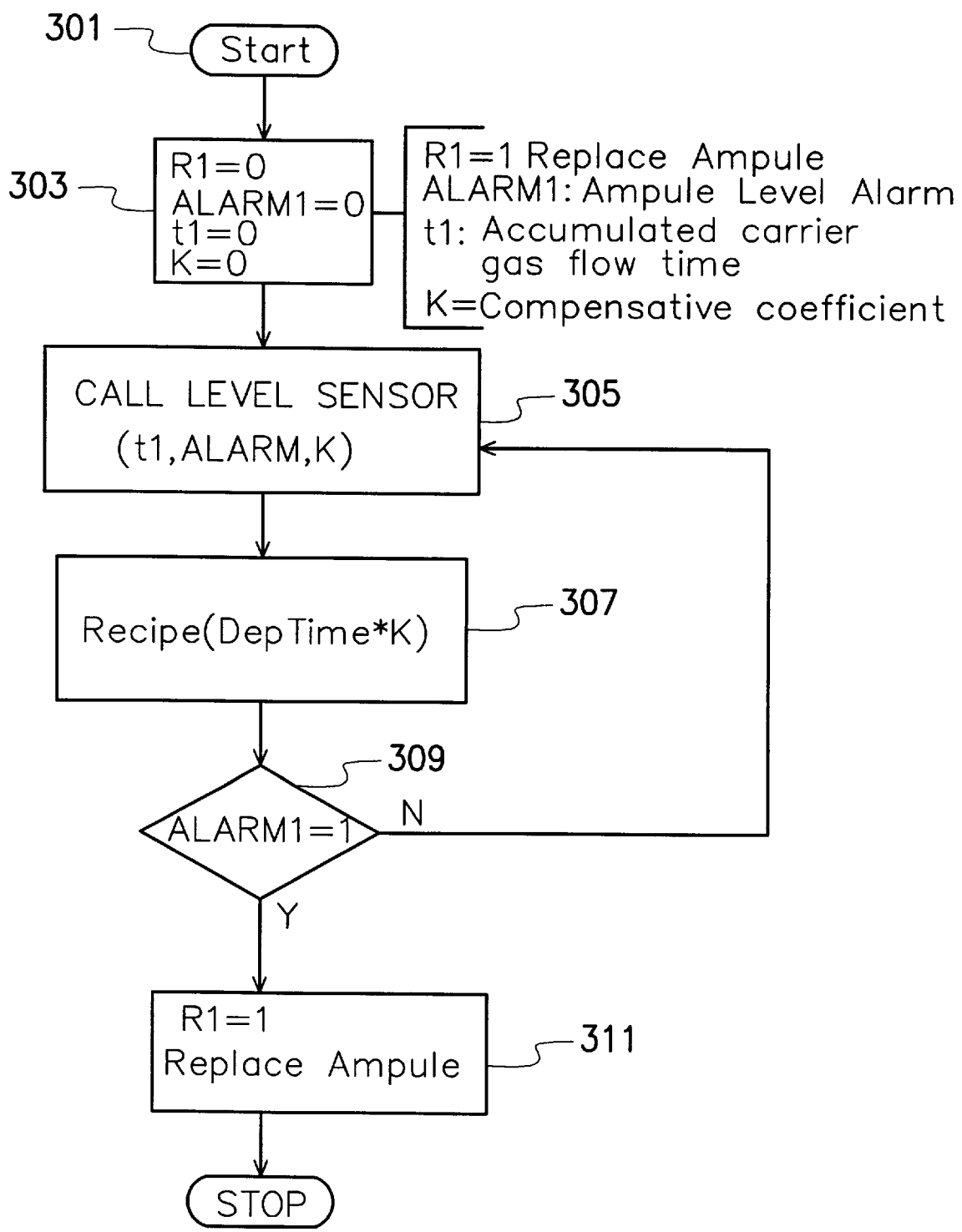
FIGS. 3A to 3B are flow charts of the program to be input into the data management device to control the deposition of a consistent thin film thickness according to the preferred embodiment of the present invention.
Figure 3B:
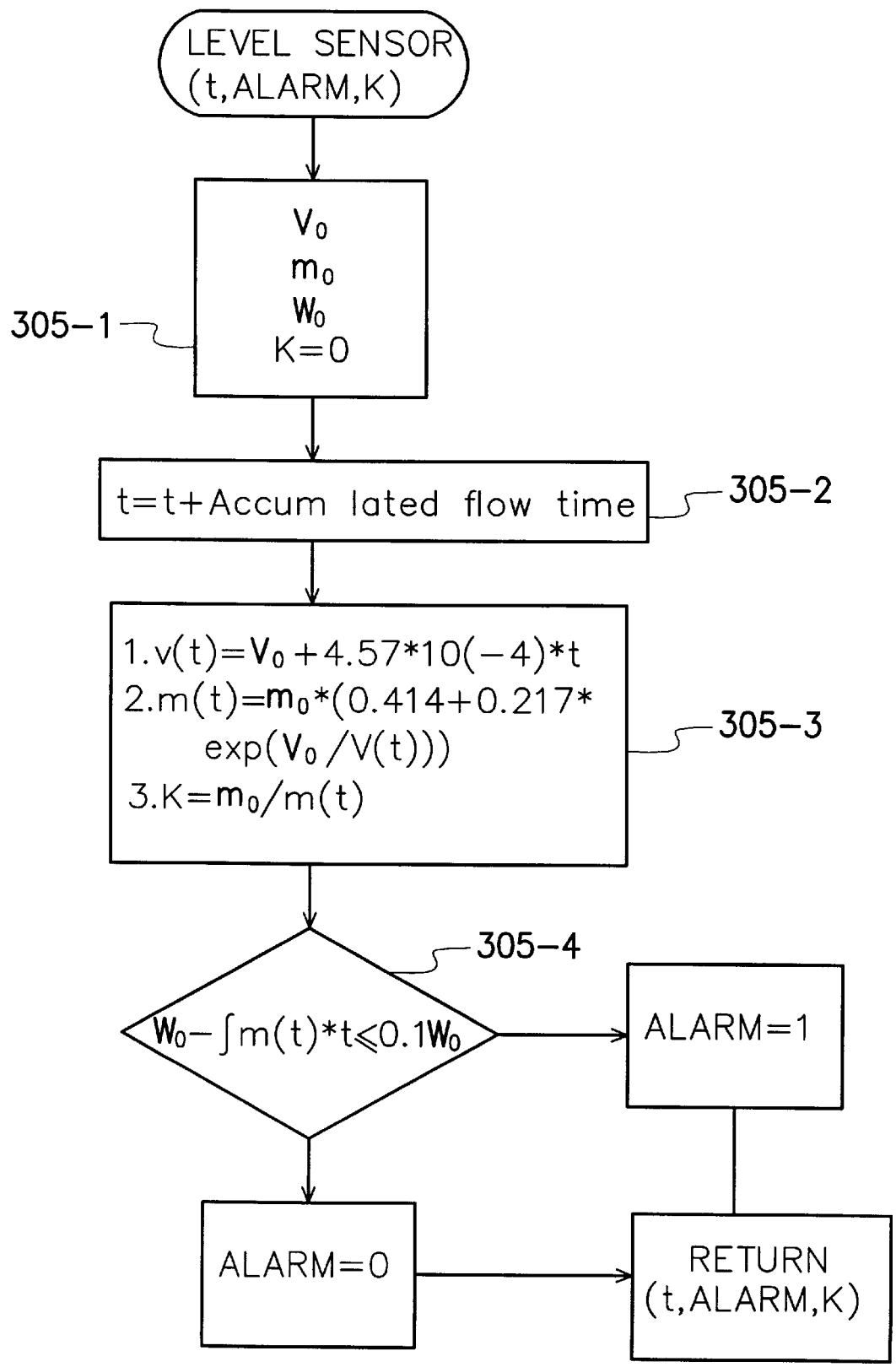

FIG. 2, which is a schematic diagram, shows parts of the chemical vapor deposition system according to the preferred embodiment of the present invention. As shown in FIG. 2, the chemical vapor deposition system comprises a reaction chamber 24, some piping, an ampule 20 to contain the reactant and a mass flow controller 22. The mass flow controller 22 generally includes a counting device (not shown) to accurately determine the flow rate and the flow time of the carrier gas in order to control the total quantity of the carrier gas. Knowing the accumulated flow time t, the compensative coefficient K can be calculated from equations (1), (2) and (3) of the present invention, and the actual deposition time T and the time point at which the ampule should be replaced are also determined. According to the embodiment of the present invention, the mass flow controller is connected to a data management device 26 (for example, a computer). A program is written to determine the actual deposition time by calculating the compensative coefficient K from equations (1) (2) and (3), where K is determined from the mass flow rates (for example, m(t) and $m_0$) of the reactants based on equation (1). The mass flow rate m(t) is determined from the volume of the gas phase (V(t)) in the ampule 20 from equation (2), wherein V(t) is determined from equation (3). The program is also written to determine when to replace the ampule 20 according to equation (4) of the present embodiment of the invention. The program is then input into the data management device to accurately control the deposition operation. FIGS. 3A and 3B are the flow charts of the program to be input into the data management device according to the present invention.

According to the present invention, the deposition operation is computerized and controlled by establishing a program in the data management device 26. FIGS. 3A and 3B are the flow charts of the program according to the preferred embodiment of the present invention. As shown in FIG. 3A, the program is initiated by a starting step 301. Step 303 is then conducted, in which the initial values for the different parameters are set. In the step of 303, the parameters such as R1, ALARM1, t1, K1 are set at 0, wherein R1 is used to determine whether the ampule is to be replaced. When R1=1, the ampule is to be replaced. The parameter ALARM is used to determine whether the value of R1 is 1. When ALARM=1, R1=1. t1 is the accumulated carrier gas flow time and K1 is the compensative coefficient, which is a variable and changes with time. The parameters used in the flow charts are provided only as an embodiment of the present invention. It will be apparent to those skilled in the art that various modifications and variations can be made to the structure of the present invention without departing from the scope or spirit of the invention.

Step 305 is then conducted in which a subroutine LEVEL SENSOR is called to obtain the values for t1, ALARM1 and K1. The flow chart for the subroutine LEVEL SENSOR is illustrated in FIG. 3B, which will be disclosed subsequently.

After this, step 307 is conducted to calculate the actual deposition time (T) by multiplying the value of K1 by the initial preset deposition time $T_0$. Step 309 is then conducted to evaluate whether the value of ALARM is equal to 1. If ALARM=1, step 311 is performed in which R1 is set to equal to 1. The deposition process is then stopped so that the ampule can be replaced. If ALARM=0, the program loops back to step 305.

Regarding to the subroutine LEVEL SENSOR, as illustrated by the flow chart in FIG. 3B, step 305-1 is conducted to obtain the values that are set for $m_0$, $V_0$ and $W_0$. The values for $m_0$, $V_0$ and $W_0$ can be set when the deposition system begins to run, or the values are inputted when the program begins to run. After this, step 305-2 is conducted to calculate the accumulated carrier gas flow time t, where t=t+flow time; for example, the flow time of each operation from the counting device of the carrier gas mass flow controller is retrieved and added to the previous accumulated flow time. After this, step 305-3 is further conducted to determine the value of K by using equations (1) (2) and (3). Step 305-4 is conducted to determine whether equation (4) is true. If equation (4) is true, the parameter ALARM is equal to 1 and the subroutine is returned to the main program. If the equation (4) is false, the ALARM is equal to 0 and the subroutine is returned to the main program.

During an actual operation, the values of the parameters $W_0$, $V_0$ and $m_0$ are set in the computer as shown in FIG. 2 and in step 305-1 of FIG. 3B, where $W_0$, $V_0$ and $m_0$ are dependent on the type of the reactant and the design of the deposition system. Using the deposition of a titanium nitride layer as an example, TDMAT is used as a reactant which is a liquid at room temperature and is thus required to have a carrier gas to deliver the reactant into the reaction chamber 24 at a mass flow rate $m_0$ of about $4.39 \times 10^{-7}$ kg/sec. The ampule 20 used in general can be filled with about 0.4 kg of TDMAT. The volume of the gas phase in the ampule after filling with TDMAT is about 783 milliliter. In other words, $W_0$ and $V_0$ are about 0.4 and about 783, respectively, in step 305-1 of FIG. 3B.

After an accumulated flow time t is retrieved from the counting device of the mass flow controller 22, it is sent to the data management device 26. The compensative coefficient K is then determined, using the program in the data management device 26, by substituting the values of $V_0$ and $m_0$ in the equations of (1), (2) and (3) as in step 305-3 of FIG. 3. Whether to replace the ampule is also determined by the data management device according to equation (4) as in Step 305-4 of FIG. 3. If equation $W_0 - \int m(t)*t \leq (1-0.9)*W_0$ is true when $W_0$ is set at 0.4, an alarm signal is issued, the deposition is stopped and the ampule 20 is replaced. Conversely, if the equation $W_0 - \int m(t)*t \leq (1-0.9)*W_0$ is false, the actual deposition time T is determined by multiplying the compensative coefficient K by the initial preset deposition time $T_0$ and the information is delivered back to the mass flow controller 22 as in FIG. 2.

After adjusting the preset deposition time by the compensative coefficient K to obtain the actual deposition time, the problem of a reduced concentration of the gas phase of the reactant leading to a reduction of the thickness of the deposited film is mitigated. A consistent thickness of the deposited film is thus obtained.

According to the preferred embodiment, the present invention comprises at least the following advantages. A compensative coefficient is determined, based on the mass flow rate of the carrier gas and the volume of the gas phase in the ampule, to obtain the actual deposition time. This information can be used to adjust the operating condition such that the thickness of the deposited thin film does not vary as the operating time of the deposition system accumulates, and a consistent thickness of the deposited thin film is obtained. Furthermore, the total amount of the reactant delivered to the reaction chamber is same as the preset value every time a thin film is deposited according to the present invention. Since the consumption rate of the reactant in each ampule of the different reaction chambers can be precisely determined, the appropriate time to replace the ampule is provided by the present invention.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method to maintain a consistent film thickness deposited by chemical vapor deposition, which method is applicable to a chemical vapor deposition system wherein a reactant is delivered to a reaction chamber of the chemical vapor deposition system, and the chemical vapor deposition system comprises at least a reaction chamber, an ampule, a mass flow controller and a data management device, and the values for an initial mass flow rate of the reactant ($m_0$), an initial volume occupied by a gas phase ($V_0$) in the ampule, and an initial weight of the reactant ($W_0$) in the ampule are preset in the data management device, the method comprising the steps of:

obtaining an accumulated time (t) from the mass flow controller;

conducting following calculations in the data management device:
   (a) $V(t) = V_0 + 4.57 \times 10^{-4} t$, wherein $V(t)$ is a volume of the gas phase in the ampule at time t;
   (b) $m(t) = m_0 \times (0.414 + 0.217 \times e^{(V_0/V(t))})$, wherein $m(t)$ is a mass flow rate of the reactant at time t;
   (c) $K = m_0/m(t)$, wherein K is a compensative coefficient;

multiplying an initial deposition time by K to obtain an actual deposition time; and;

conducting chemical vapor depositing for duration of the actual deposition time.

2. The method to maintain a consistent film thickness deposited by chemical vapor deposition according to claim 1, wherein the method further includes a determining step to decide whether the ampule is to be replaced by determining when a percentage of the reactant in the ampule is consumed.

3. The method to maintain a consistent film thickness deposited by chemical vapor deposition according to claim 2, wherein the determining step includes:

conducting the following calculation $W_0 - \int m(t)*t \leq (1-0.9)*W_0$; and (d)

determining whether equation (d) is true.

4. The method to maintain a consistent film thickness deposited by chemical vapor deposition according to claim 3, wherein the ampule is replaced when equation (d) is true.

5. The method to maintain a consistent film thickness deposited by chemical vapor deposition according to claim 1, wherein the reactant includes TDMAT.

* * * * *